(12) United States Patent
Eskridge

(10) Patent No.: US 7,932,570 B1
(45) Date of Patent: Apr. 26, 2011

(54) SILICON TAB EDGE MOUNT FOR A WAFER LEVEL PACKAGE

(75) Inventor: Mark Eskridge, Renton, WA (US)

(73) Assignee: Honeywell International Inc., Morristown, NJ (US)

( * ) Notice: Subject to any disclaimer, the term of this patent is extended or adjusted under 35 U.S.C. 154(b) by 11 days.

(21) Appl. No.: 12/615,188

(22) Filed: Nov. 9, 2009

(51) Int. Cl.
H01L 29/82 (2006.01)

(52) U.S. Cl. ........ 257/417; 257/678; 257/691; 257/692; 257/693; 257/787

(58) Field of Classification Search .................. 257/417, 257/678, 691, 692, 693, 787
See application file for complete search history.

(56) References Cited

U.S. PATENT DOCUMENTS

2008/0315390 A1* 12/2008 Kuhmann et al. ............. 257/690
2009/0152653 A1*  6/2009 Borzabadi et al. ............ 257/415

* cited by examiner

Primary Examiner — Long Pham
(74) Attorney, Agent, or Firm — Black Lowe & Graham PLLC

(57) ABSTRACT

A Micro-ElectroMechanical Systems (MEMS) device having electrical connections (a metallization pattern) available at an edge of the MEMS die. The metallization pattern on the edge of the die allows the die to be mounted on edge with no further packaging, if desired.

8 Claims, 5 Drawing Sheets

SILICON TAB EDGE MOUNT FOR A WAFER LEVEL PACKAGE

BACKGROUND OF THE INVENTION

In order for a Micro-ElectroMechanical Systems (MEMS) sensor to be useful, it must be electrically connected to a system capable of interpreting its signals. It must also be mechanically mounted to the system, either directly or through an intermediate "electronics package" into which it is placed.

Most MEMS dies are laid out with electrical connections on one side ("top") and mechanical connections on the other ("bottom"). In some cases, the electrical and mechanical attachments to the next level of the system are the same. This is known as "flip chip" die attach. The die is attached to the system on its face or back. A number of possible scenarios using wirebonding, various epoxies, solders, and direct attachments can be used to package the MEMS die in these orientations.

Sometimes it is desirable to mount MEMS sensors on one "edge" of the die. This can be because:

The die senses acceleration or rotation (accelerometer or gyro) and all three axes of motion are required for the system;

Mounting stress on the edge of the die is better for performance than on the top or bottom;

Heat from the system is best applied to a die edge for a performance reason; and The system has geometric requirements for this configuration (space savings).

It is also often important when packaging MEMS into a system to make it as small as possible, avoiding secondary packaging where possible to reduce size, mass, and cost.

SUMMARY OF THE INVENTION

The present invention provides a Micro-ElectroMechanical Systems (MEMS) device having electrical connections (a metallization pattern) available at an edge of the MEMS die. The metallization pattern on the edge of the die allows the die to be mounted on edge with no further packaging, if desired.

BRIEF DESCRIPTION OF THE DRAWINGS

Preferred and alternative embodiments of the present invention are described in detail below with reference to the following drawings.

DETAILED DESCRIPTION OF THE INVENTION

The present invention provides for systems and methods for electrically connecting a Micro-ElectroMechanical Systems (MEMS) die. With a proper metallization pattern on the edge of the MEMS die, the die is then mounted on edge with no further packaging, if desired.

Figure 1:
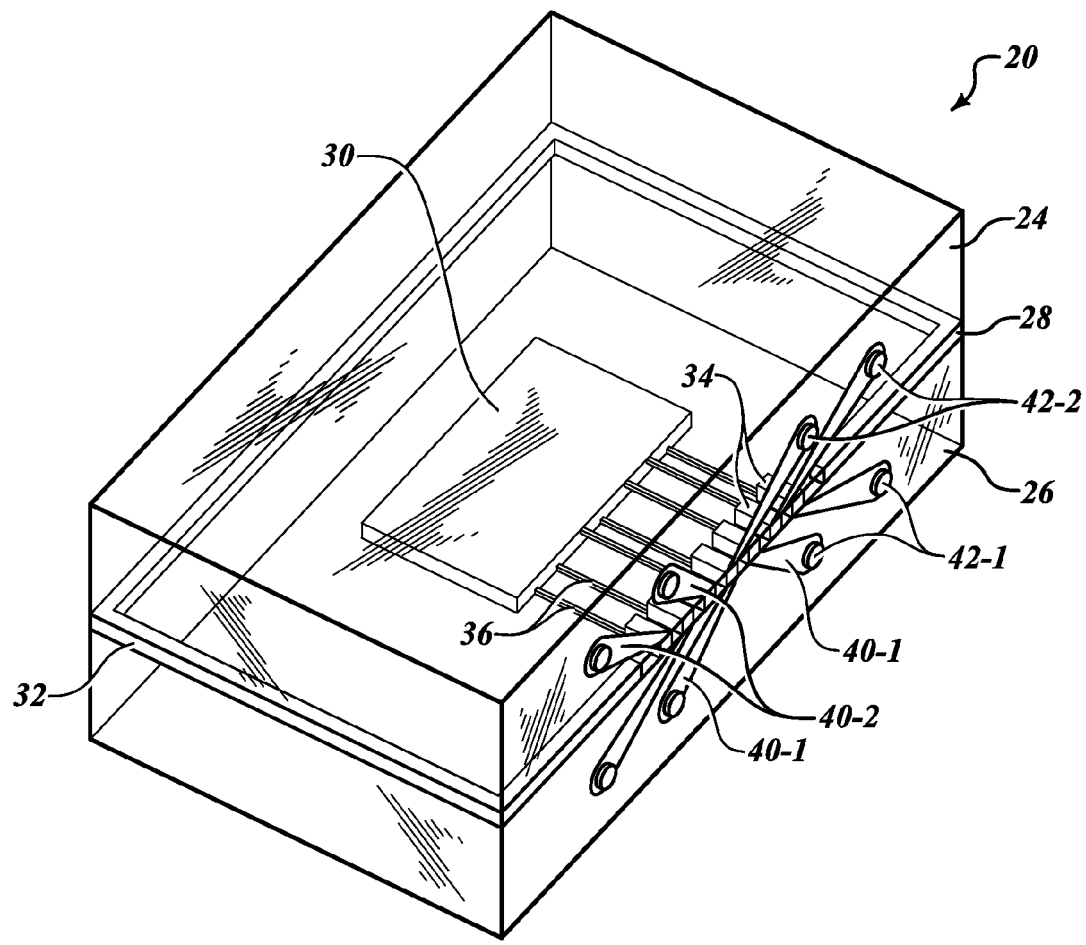
FIG. 1 is an x-ray perspective view of a MEMS die formed in accordance with an embodiment with the present invention.

FIG. 1 shows a MEMS die 20 formed according to an embodiment of the present invention. The MEMS die 20 is a sandwich of a silicon layer 28 between two plates of nonconductive borosilicate glass 24, 26. The glass plates 24, 26 are preferably anodically bonded to a partial seal ring 32. The glass plates 24, 26 are transparent for illustrative purposes.

The glass plates 24, 26 are thicker compared to the silicon layer 28. In one embodiment, the silicon layer 28 is a reactive ion etched pattern and is attached to the glass plates 24, 26 using an anodic bond.

The silicon layer 28 includes a MEMS device 30 that is located at approximately the center of the die 20. Electrical leads 36 extend from the MEMS device 30 to conductive silicon tabs 34 located at the edge of the die 20. In one embodiment, some of the leads 36 are located on the lower glass plate 26 and some on the upper plate 24. The leads 36 connect to either active metal surfaces or sections of the MEMS device 30.

The tabs 34 are formed in the same operation and are in the same layer as the MEMS device 30. On a wafer during fabrication, the tabs 34 extend into a dicing street or even across it to be shared with a neighbor die. During singulation of the wafer, the silicon tabs 34 are cut clean and flush with the glass surface (edge of the die 20).

Electrical leads (metal traces) 40-1, 40-2 are attached to the edge of the plates 24, 26 and exposed faces of the silicon tabs 34. Metallic bumps 42-1, 42-2 are bonded to ends of the leads 40-1, 40-2.

Figure 2:
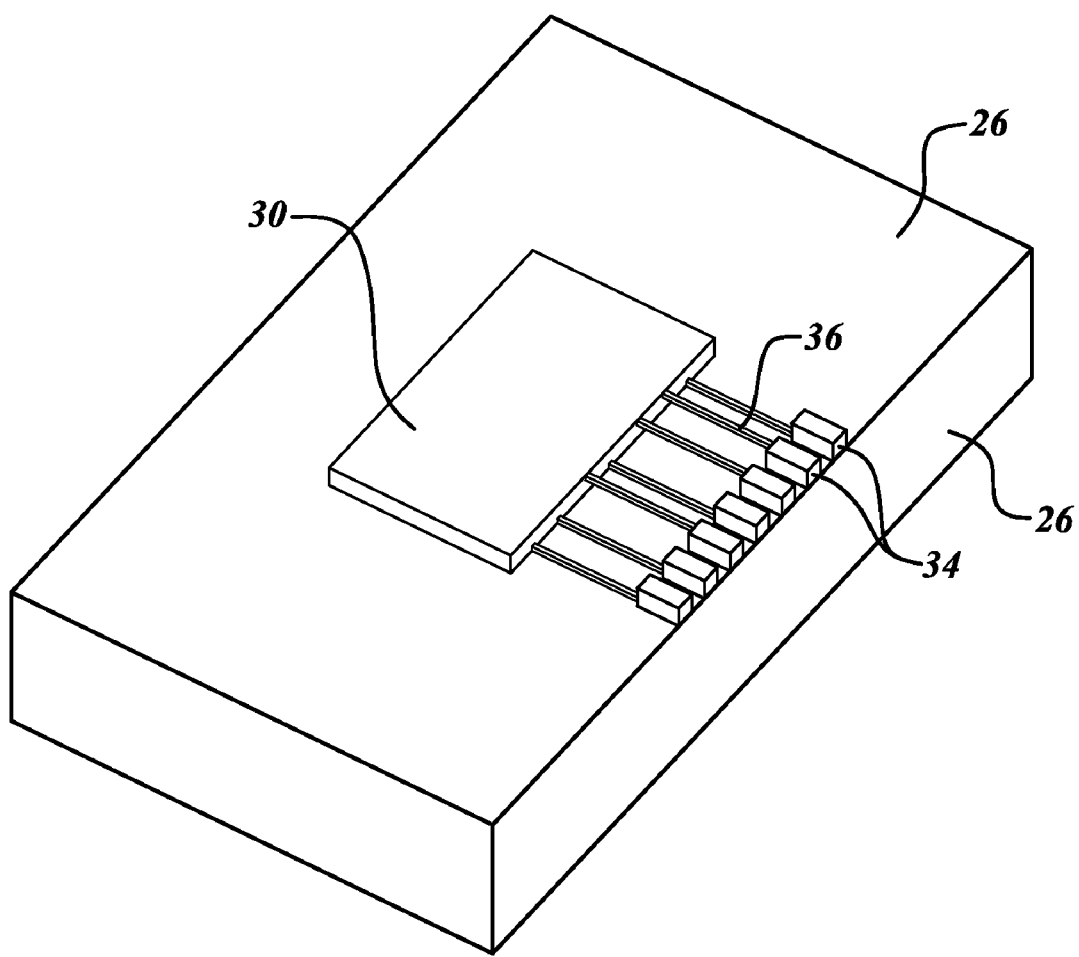
FIG. 2 is a partial perspective view of the MEMS die shown in FIG. 1.

FIG. 2 is a simplified perspective view showing a block representing the MEMS device 30, the leads 36, and the silicon tabs 34, as diced during die separation. The upper glass plate 24, the seal ring 32, and edge metal traces 40-1, 40-2 are not shown. Though the upper glass plate 24 is not shown, some of the electrical leads 36 plated to the upper glass plate 24 are shown.

Once the die is diced, the edge of interest includes glass, possibly small gaps, and the diced ends of the conductive silicon tabs 34. Electrical leads 40-1, 40-2 are now formed on the edge of the die 20 using any of several known methods, for example, by evaporation of metals through an aperture mask. The electrical leads 40-1, 40-2 distribute the signal to any convenient location on the edge of the die 20 for connection to another device (not shown), such as a circuit board, another stacked die (especially a signal processor Application-Specific Integrated Circuit (ASIC) or Field-Programmable Gate Array (FPGA)), a substrate with other active and passive parts (e.g., a "package on package" or "stacked package"), another MEMS sensor (to conserve space or create a set of inertial sensors for two or three axis).

Figure 3:
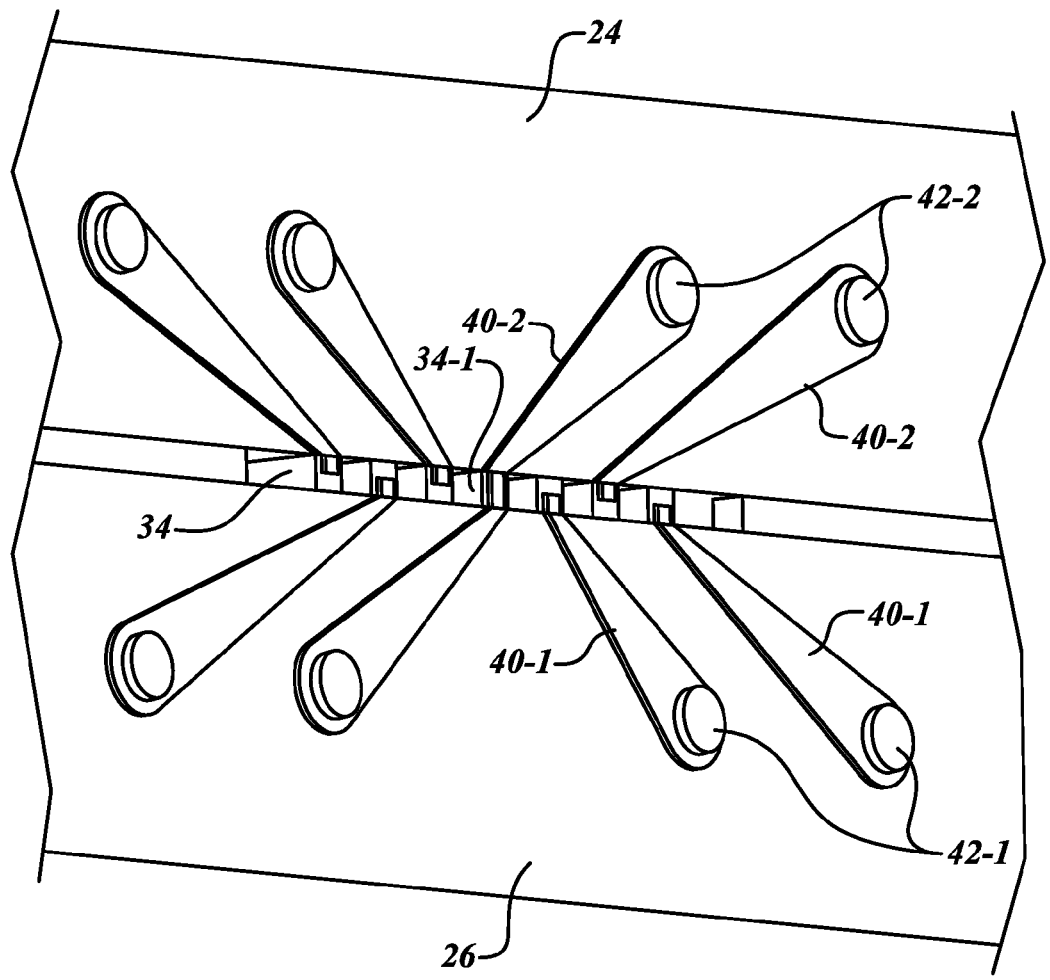
FIG. 3 is a partial side view of the MEMS die shown in FIG. 1.

FIG. 3 illustrates the electrical leads 40-1, 40-2 connecting to exposed faces of the silicon tabs 34. In this example, bumps 42-1, 42-2 for connection to another device(s) are shown. The bumps 42-1, 42-2 are made of solder balls, gold stud bumps, conductive epoxy, or another adhesive with conductive properties. In one embodiment, a tab 34-1 is connected to a lead on the upper glass plate 24 and a lead on the lower glass plant 26 two bump locations, thus allowing connection to two connection points on the other device(s). Other metal patterns might be used, for example, to provide shielding between the signals or a connection to "ground" for a Faraday cage.

In one embodiment, the electrical leads 40-1, 40-2 includes a metal stack of two or more metal layers. For example, the layers include an adhesion layer (e.g., Ti, Cr) that adheres to the glass plates 24, 26 and the tabs 34, a trace layer (e.g., Au, Pb, Sn) for connecting to external circuit components, and a barrier layer (e.g. Pt, Cr) for allowing the trace layer to bond with the adhesion layer.

In one embodiment, the partial seal ring 32 is formed in the same layer 28 as the tabs 34. The silicon ring 32 seals around the edge of the die 20, except where the tabs 34 are located. If a completely sealed die is required, then a nonconductive sealant (not shown) is applied in the area around or behind the tabs 34. For example, a glass frit or epoxy could be used. This could be applied to the edge of the die to fill the gaps between tabs 34 after the die was formed, or applied through a hole (not shown) in the upper or lower glass plates 24, 26 after the glass is subjected to silicon bonding but before dicing. A dielectric barrier may be formed in the device layer 28 to keep the frit or epoxy from extending too far into the MEMS cavity prior to that material bonding.

This works just as well for other dies where fabrication makes forming silicon tabs at the edge of the die feasible, and where a means for electrically isolating the metallization from the edge of the die is possible. For example, a patterned dielectric could be printed on the edge of the die with holes in the pattern over the ends of the silicon tabs. The metallization could then be applied over the dielectric, as described above.

Figure 4:
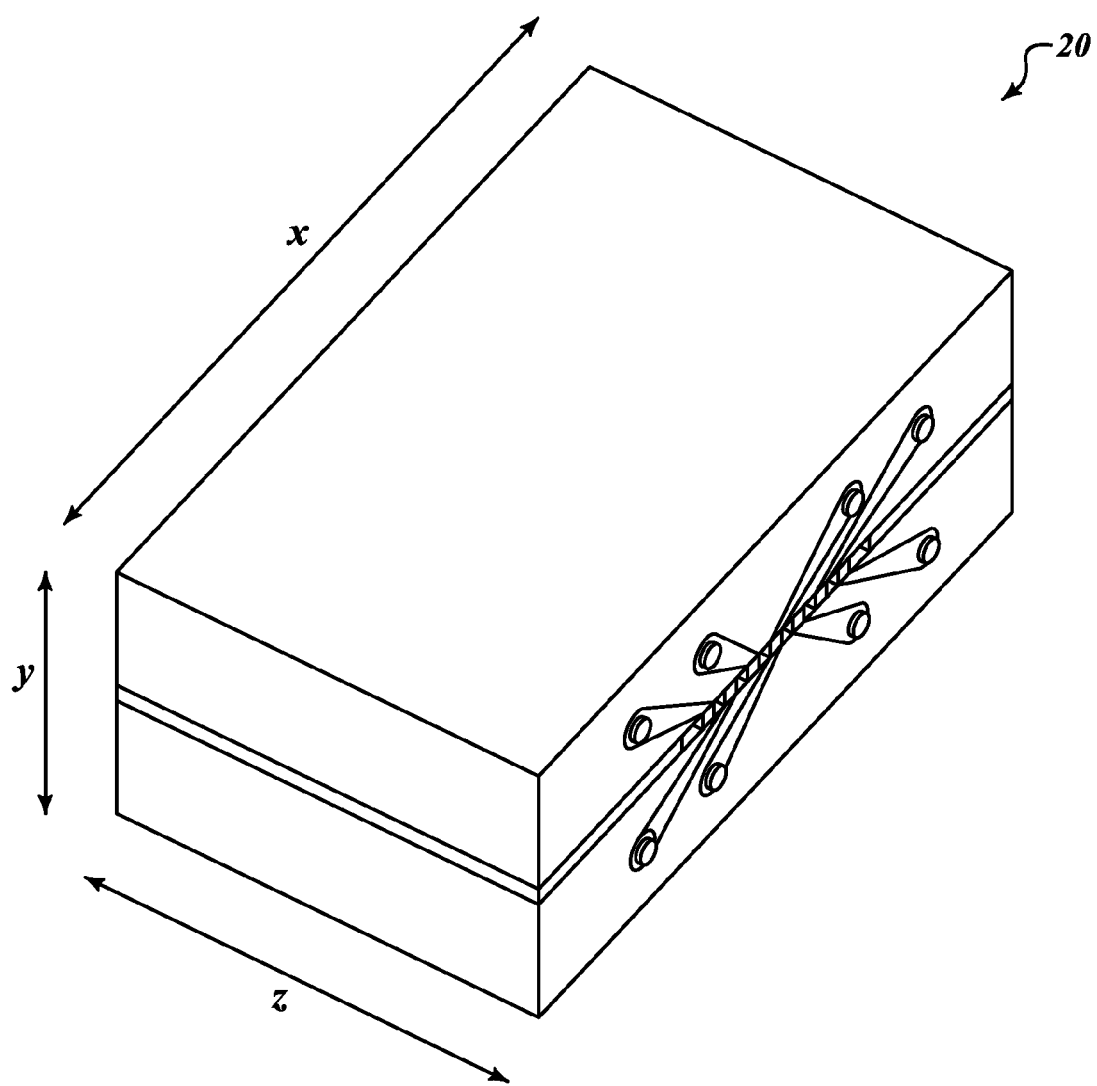
FIG. 4 is a perspective view of the MEMS die shown in FIG. 1.
Figure 5:
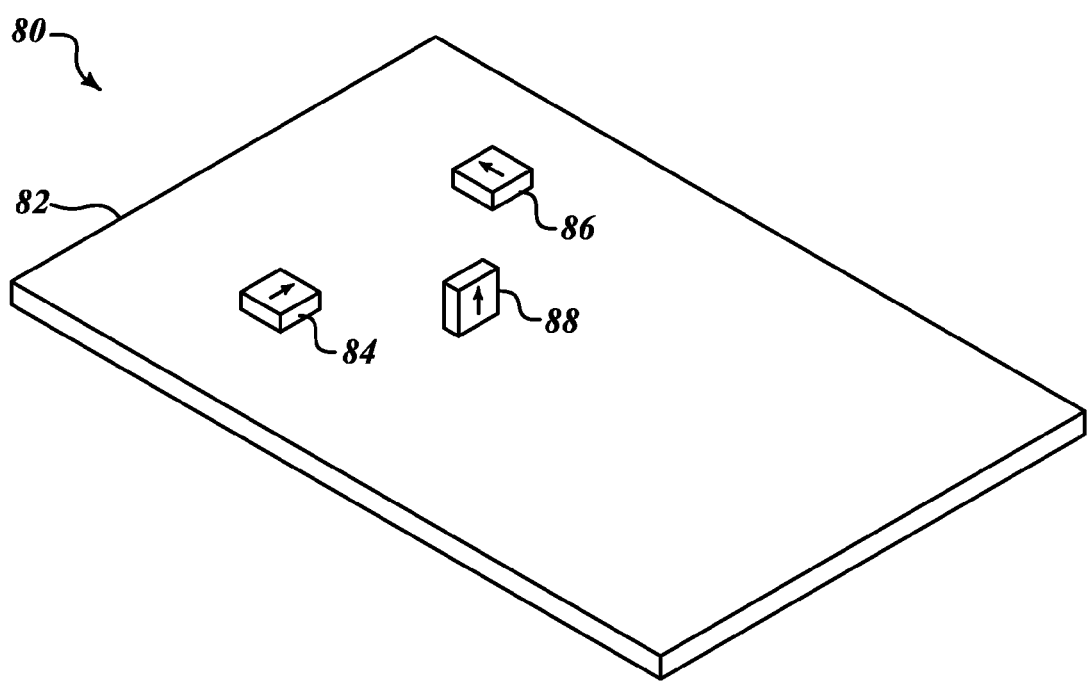
FIG. 5 is a perspective view of a system with a MEMS die formed in accordance with an embodiment with the present invention mounted thereon.

The die 20 is now ready for the next level of packaging, as shown in FIG. 4. The die 20 might be protected in a block of polymer (plastic), which could also complete the seal of the die. The die 20 could be simply mounted to a circuit board 82, such as in a system 80 shown in FIG. 5. The die 20 could also be placed within another package, if further sealing or protection is necessary.

Die are often thinned in order to reduce the overall height of a system. Consumer products pride themselves in being thin—so the parts within must be thin as well. In this case, the dies do not have to be thinned. Since thickness is controlled by the width of the die ("z" in FIG. 4) and thinning makes the thickness of the die smaller ("y" in FIG. 4) there's less need to thin the die. This allows the wafers to be handled without undue concern about breakage. Thick wafers make for more surface area to mount the die. Controlling the overall height of the MEMS die would be accomplished by making the die smaller by design and dicing.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A Micro-ElectroMechanical Systems (MEMS) package comprising:
   a first glass layer comprising a top side, a bottom side, and a third side being connected between the top and bottom sides;
   a second glass layer comprising a top side, a bottom side, and a third side being connected between the top and bottom sides;
   a device layer bonded between the first and second glass layers, the device layer comprising:
      a MEMS device;
      one or more conductive tabs comprising a surface colocated with the third sides of the first and second glass layers; and
      one or more conductive traces electrically connecting the one or more conductive tabs to the MEMS device; and
   one or more metalized deposits located on the surface of the one or more conductive tabs and at least one of the third sides of the first and second glass layers.

2. The package of claim 1, wherein the device layer further comprises a partial seal surrounding the MEMS device.

3. The package of claim 2, further comprising a sealant located in spaces between the tabs and the seal.

4. The package of claim 3, wherein the sealant includes frit.

5. The package of claim 3, wherein the sealant includes a dielectric epoxy.

6. The package of claim 1, wherein the one or more metalized deposits comprises at least a metallic adhesion layer and a trace layer.

7. The package of claim 1, wherein the MEMS device comprises a sensor configured to sense motion having a vector being approximately perpendicular to the third sides of the first and second glass layers.

8. The package of claim 1, wherein the third side is perpendicular to the top and bottom sides.

* * * * *